(12) United States Patent
Lane

(10) Patent No.: US 9,130,536 B2
(45) Date of Patent: Sep. 8, 2015

(54) RADIO FREQUENCY SIGNAL SPLITTER AND MATCHER

(71) Applicant: Tokyo Electron Limited, Tokyo (JP)

(72) Inventor: Barton Lane, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 140 days.

(21) Appl. No.: 13/948,882

(22) Filed: Jul. 23, 2013

(65) Prior Publication Data

US 2015/0028962 A1  Jan. 29, 2015

(51) Int. Cl.
*H01P 5/12* (2006.01)
*H03H 7/42* (2006.01)

(52) U.S. Cl.
CPC . *H03H 7/422* (2013.01); *H01P 5/12* (2013.01)

(58) Field of Classification Search
CPC ............ H03H 7/38; H03H 7/48; H03H 7/422
USPC ................ 333/26, 33, 35, 115, 116, 124, 125
See application file for complete search history.

(56) References Cited

U.S. PATENT DOCUMENTS

| | | | |
|---|---|---|---|
| 2,700,129 A * | 1/1955 | Guanella | 323/355 |
| 2,925,565 A * | 2/1960 | Cook et al. | 333/1.1 |
| 3,249,863 A * | 5/1966 | Wright | 324/629 |
| 3,365,721 A * | 1/1968 | Bittner | 343/856 |
| 3,701,057 A * | 10/1972 | Hoer | 333/112 |
| 3,829,770 A * | 8/1974 | Stevens | 324/95 |
| 4,547,731 A * | 10/1985 | Teratani et al. | 324/539 |
| 4,647,868 A | 3/1987 | Mueller | |
| 4,859,971 A * | 8/1989 | Edwards et al. | 333/109 |
| 4,973,926 A * | 11/1990 | Yu | 333/112 |
| 5,952,896 A * | 9/1999 | Mett et al. | 333/32 |
| 7,112,926 B2 | 9/2006 | Homori | |
| 2007/0255269 A1 | 11/2007 | Shin | |

FOREIGN PATENT DOCUMENTS

WO    WO9837627 A1    8/1998

* cited by examiner

*Primary Examiner* — Robert Pascal
*Assistant Examiner* — Kimberly Glenn
(74) *Attorney, Agent, or Firm* — Rothwell, Figg, Ernst & Manbeck, P.C.

(57) ABSTRACT

This application relates to systems and methods for splitting a current signal into at least two signals that are out of phase with each other. The power splitter may include a conductive element that may generate standing magnetic field that alternates at specified frequency. An inductor placed near or in the magnetic field may induce an alternating current at the specified frequency. Each end of the inductor may be coupled to a connector that may be coupled to an antenna that may be incorporated into a plasma processing chamber.

24 Claims, 6 Drawing Sheets

RADIO FREQUENCY SIGNAL SPLITTER AND MATCHER

FIELD OF INVENTION

The invention relates to a processing system and method for splitting power from a radio frequency (RF) power source by dividing a current flow received from the RF power source. The system may also match the impedance of the power generators and the devices that receive the current.

BACKGROUND

During material processing, such as semiconductor device manufacturing for production of integrated circuits (ICs), plasma-enhanced chemical vapor deposition (PECVD), plasma etching, and/or plasma doping of a substrate are common techniques to treat substrates. For example, in semiconductor manufacturing, such vapor deposition processes may be used for gate dielectric film formation in front-end-of-line (FEOL) operations, and low dielectric constant (low-k) or ultra-low-k, porous or non-porous, dielectric film formation and barrier/seed layer formation for metallization in back-end-of-line (BEOL) operations, as well as capacitor dielectric film formation in Dynamic Random Access Memory (DRAM) production.

In a PECVD process, the CVD process further includes plasma that may be utilized to alter or enhance the film deposition mechanism. For instance, plasma excitation can allow film-forming reactions to proceed at temperatures that are significantly lower than those typically required to produce a similar film by thermally excited CVD. In addition, plasma excitation may activate film-forming chemical reactions that are not energetically or kinetically favored in thermal CVD.

In a plasma etch process, the etch process further includes plasma that may be utilized to generate ions that may be used to etch a surface of the substrate. For instance, plasma excitation may generate ions that may be used to impact the substrate surface to remove a portion of the substrate surface.

In a plasma doping process, the doping may include implanting ions from the plasma into a substrate. The implanted ions may alter the electrical properties of the substrate to facilitate the flow of current within the substrate.

SUMMARY

The application relates to a Radio Frequency (RF) splitter and/or matcher to provide current to a plasma processing chamber that may be used for chemical vapor deposition (CVD), etching, and/or doping a substrate.

According to one embodiment, the splitter may be configured to maintain a standing wave of alternating current (AC) that may be used to induce current in an inductor that may provide current or power to a plasma processing chamber. The splitter may comprise a conductive element configured to transmit alternating current or power in a standing wave. The standing wave may include a resonant wave of a certain current and/or frequency. In one instance, the standing wave may include a low or zero voltage point near a center portion of the conductive element. A higher voltage point and a lower voltage point may be present at opposite ends of the conductive element. A magnetic field may be generated around the conductive element as a result of the voltage profile along the conductive element. In one instance, the magnetic field may extend around a longitudinal axis (e.g., the axis being along an end-to-end of a rod) of the conductive element when the alternating current or voltage is received from a RF generator. The magnetic field may be circular and lies in a plane perpendicular to the longitudinal axis. As the alternating current oscillates along the conductive element, the magnetic field oscillates, in direction, around the conductive element.

The splitter may also include an inductor that is physically separate from the conductive element and adjacent to the zero or low voltage point. The inductor may be positioned to receive the maximum magnitude of the magnetic field that may be generated by the conductive element. Generally, the low voltage point on the conductive element may also be the location of a high magnitude of the magnetic field. In one embodiment, the inductor may include a first end configured to transmit current based, at least in part, on the inductor receiving the magnetic field when is being generated in a first direction. The inductor may also include a second end configured to transmit current based, at least in part, on the inductor receiving the magnetic field that may be generated in a second direction. In one embodiment, the inductor may comprise a loop with two ends, the changing magnetic flux through a surface whose edge contains the loop induces an electromotive force within the loop driving current in one end and out the other end. In this case, the alternating standing or resonant magnetic wave may drive the current from each end of the inductor that is out of phase with the other. Accordingly, the splitter may have two current output ports that may be coupled to separate antenna components in a plasma processing chamber. In one specific embodiment, the current from each current output may be approximately 180 degrees out of phase.

In another embodiment, the power splitter may also include two or more capacitor elements in series with the conducting rod that may be optimized to generate a standing wave along the conductive element. In one specific embodiment, the series capacitor elements may range in capacitance between approximately 10 pF and 50 pF. The capacitor elements may be variably controlled to account for different current conditions that may be applied to the power splitter.

In another embodiment, the power splitter may also include a matching impedance element that may match the impedance of the RF generator to the plasma processing chamber. The matching impedance element may include a capacitor that is parallel to the standing wave capacitors.

In another embodiment, the power splitter may include two or more inductors that are placed proximate to or within the magnetic field generated by the conductive element. In this way, a single standing wave may be used to provide pairs of output signals that are out of phase with each other. In one instance, the power splitter may include four inductors to generate four power output pairs. It should be noted, the four inductors are intended illustrate an embodiment for the purpose of explanation and not limitation.

BRIEF DESCRIPTION OF THE DRAWINGS

The features within the drawings are numbered and are cross-referenced with the written description. Generally, the first numeral reflects the drawing number where the feature was first introduced, and the remaining numerals are intended to distinguish the feature from the other notated features within that drawing. However, if a feature is used across several drawings, the number used to identify the feature in the drawing where the feature first appeared will be used. Reference will now be made to the accompanying drawings, which are not necessarily drawn to scale and wherein.

DETAILED DESCRIPTION OF SEVERAL EMBODIMENTS

In the following description, in order to facilitate a thorough understanding and for purposes of explanation and not limitation, specific details are set forth, such as a particular geometry of the processing system and descriptions of various components, as well as the methods and processes used therein.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, the application relates to a Radio Frequency (RF) power splitter and/or impedance matcher to provide current or power to a plasma processing chamber that may be used for, but is not limited to, CVD, etching, and/or doping a substrate. Broadly, the application describes a system and method of splitting a single current signal into multiple signals that may be used by one or more current consumption systems. In one instance, the current consumption system may be a plasma processing chamber.

Figure 1:
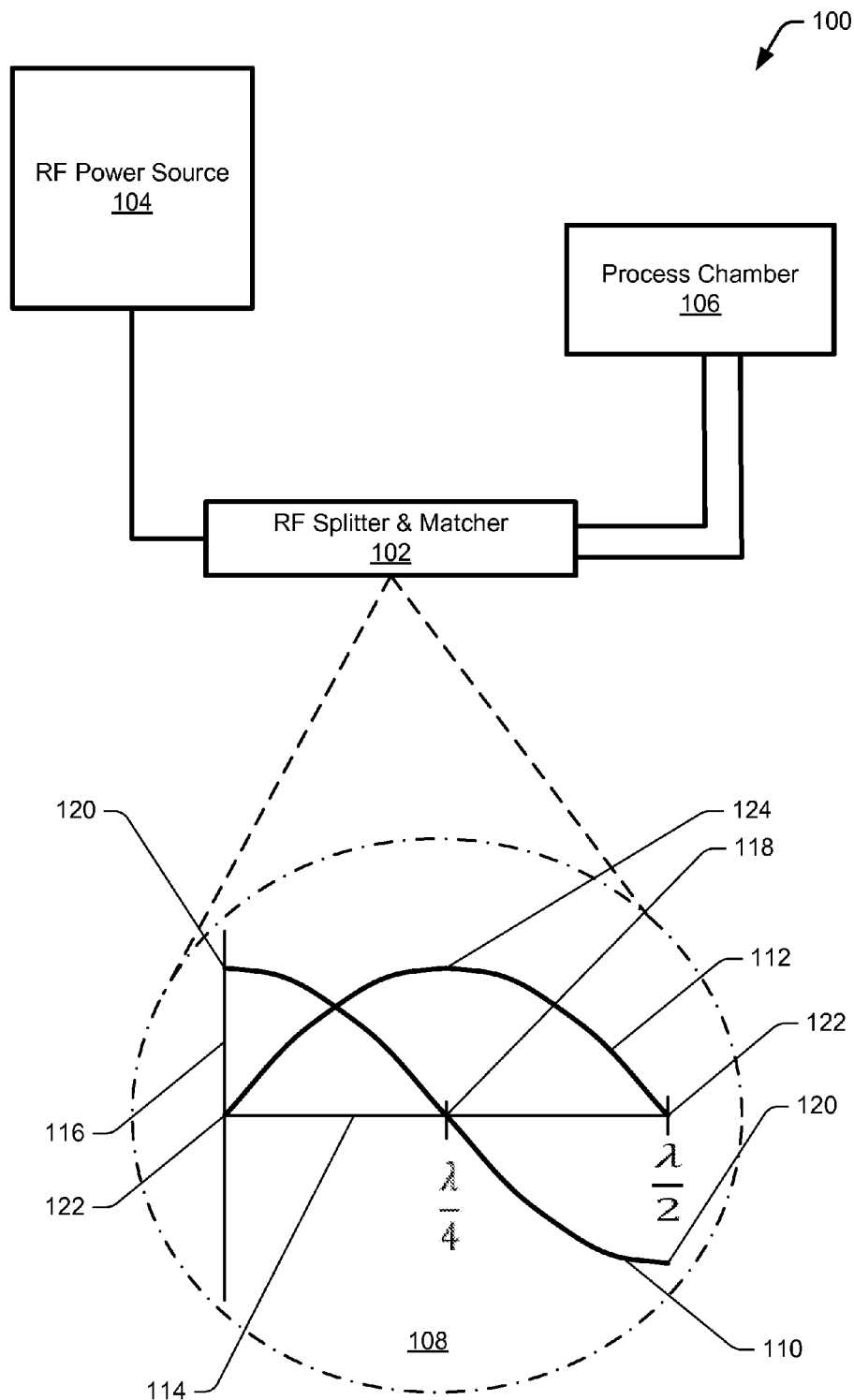
FIG. 1 illustrates a simplified block diagram of a representative plasma processing system that may include a power splitter and impedance matcher as described in one or more embodiments of the disclosure.

Referring now to the drawings, FIG. 1 illustrates a simplified block diagram of a representative plasma processing system 100 that may include a power splitter and impedance matcher 102, a RF power source 104, and a process chamber 106. In one embodiment, the RF power source 104 may provide a current signal to the power splitter 102 to divide the current signal into two current signals. The divided current signals may be out of phase from each other and may each have a distinct output line that may be coupled to the process chamber 106.

The power splitter 102 may also include impedance matching components (not shown) that may be controlled to match the impedance of the RF power source 104 to the process chamber 106. The impedance matching may prevent power from being reflected back to the RF power source 104 from the process chamber 106.

The power splitter 102 may also be tuned to generate a standing wave or resonant wave along a conductive element (not shown). The standing wave diagram 108 illustrates a standing wave representation of a voltage signal 110 and a magnetic field 112. The standing waves 108 may include a node where the voltage signal 110 does not move and may have a minimal or zero magnitude and an antinode that may be the maximum or minimum magnitude of the voltage signal 110 signal. In this embodiment, the standing waves 108 may have a wavelength along the x-axis 114 and amplitude along the y-axis 116. In one embodiment, the standing waves 108 may be a half wavelength of the signal from the RF power source 106 as shown along the x-axis 114. The signal from the RF power source 106 may generate a voltage signal 110 and a magnetic field 112 within the power splitter 102. In this embodiment, the voltage signal 110 may include a node 118 near the center of the conductive element (not shown) or approximately a distance of approximately a quarter wavelength along the conductive element. Accordingly, the antinodes 120 of the voltage signal 110 may be at the ends of the conductive element (not shown) indicating the maximum and minimum magnitudes of the voltage signal 110. The maximum magnitudes may include a maximum positive value and a maximum negative value. The magnetic field 116 may also have a node 122 where the magnitude of the magnetic field 116 is low or near zero. The magnetic field 116 may also include an antinode 124 where the magnitude of the magnetic field may be at a maximum magnitude.

Figure 2:
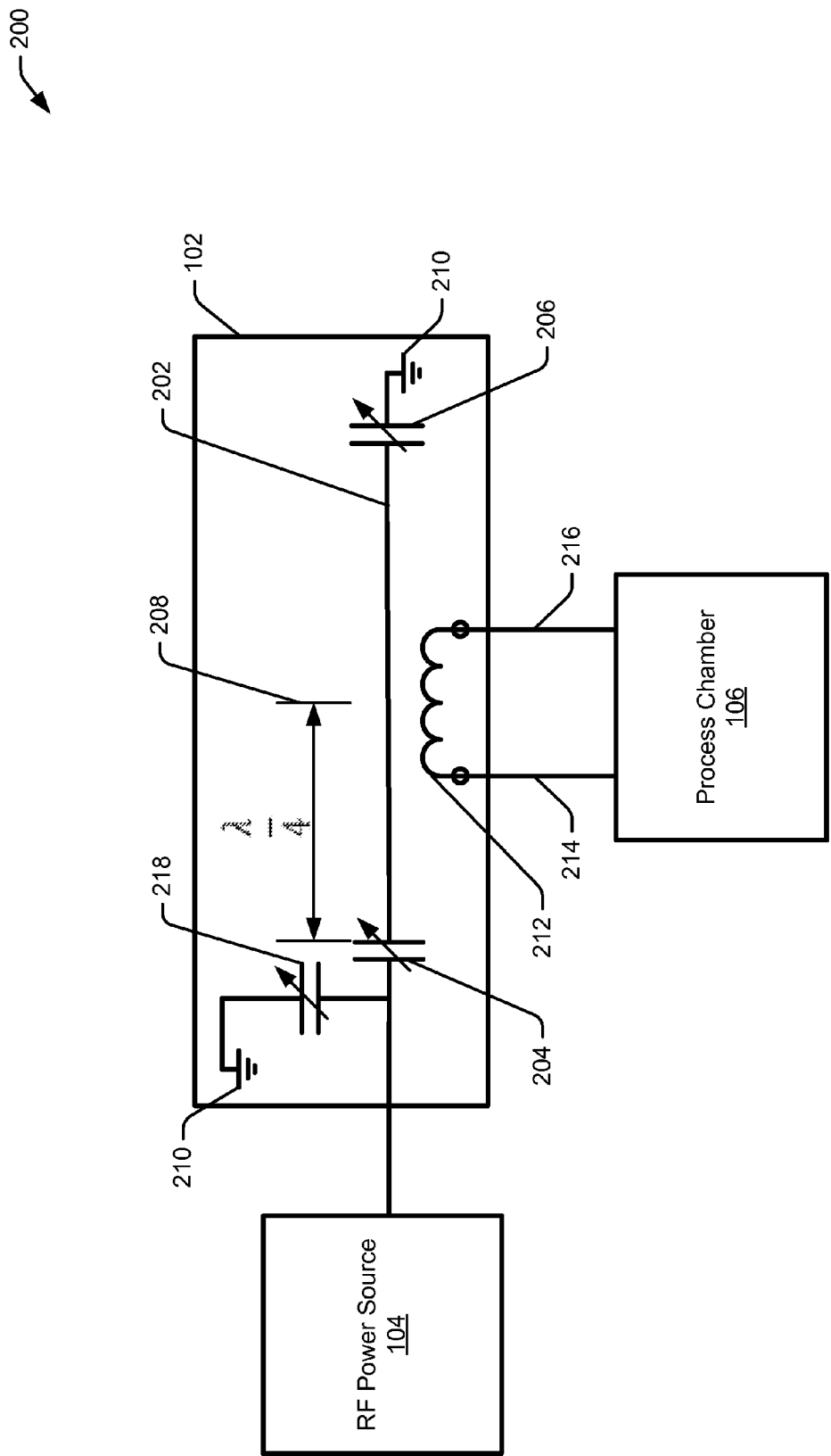
FIG. 2 illustrates one embodiment of the power splitter and impedance matcher as described in one or more embodiments of the disclosure.

FIG. 2 illustrates a system 200 that may include one embodiment of the power splitter 102 that may include a conductive element 202 that transmit the standing wave 108 that may include the voltage signal 110 and the magnetic field 112. The standing wave 108 may be centered along the conductive element 202, such that the node 118 of the voltage signal 110 is near the center of the conductive element 202 and the antinodes 120 may be near the ends of the conductive element 202. Accordingly, the maximum magnitude of the magnetic field 112 may be near the center of the conductive element 202 as shown by the magnetic antinode 124.

In this embodiment, the conductive element 202 may be a rod that may include metallic or conductive elements that enable current to flow the through the rod. The rod may be disposed between a first tuning capacitor 204 and a second tuning capacitor 206 that may be used generate a standing wave 108 along the rod. The tuning capacitors 204, 206 may be adjusted to place the node 118 of the voltage signal 110 and the antinode 124 of the magnetic field 112 near the center of the rod. In one instance, this placement may be ¼ of the wavelength 208 of the signal provided by the RF power source 104. Accordingly, the distance between the tuning capacitors 204, 206 may be at least ½ of the wavelength of the signal provided by the RF power source 104. The second tuning capacitor 206 may also be coupled to electrical ground 210.

The first and second tuning capacitors 204, 206 may be used to adjust the alternating current flow from the signal received from the RF power source 104. As the current flow oscillates along the length of the conductive element, the standing waves may be maintained based, at least in part, on the settings of the first and second tuning capacitors 204, 206. The direction of the magnetic field 112 may oscillate based, at least in part, on the direction of the current flow in the conductive element. The direction of the magnetic field 112 may be perpendicular the current flow through the conductive element. For example, as the current flow oscillates along the direction of the conductive element 202, the direction of the magnetic field 112 oscillates in a direction that may be to perpendicular to the direction of the current flow. The oscillation of the current and the magnetic field 112 may oscillate in polarity by approximately 180 degrees. In one specific embodiment, the magnetic field 112 may be oscillating in two opposing directions around the conductive element 202.

In one specific embodiment, the frequency of the alternating current may range between approximately 40 MHz and 200 MHz. The first and second tuning capacitors 204, 206 may range in capacitance between 10 pF and 50 pF to maintain a standing wave of the voltage signal 110 and the magnetic field 112 associated with the alternating current in the conductive element 202. In yet another embodiment, the second tuning capacitor 206 may be omitted from the powers splitter 102. In this instance, the capacitive properties of the conductive element 202 may be used to function as the second tuning capacitor 206. In this way, the first tuning capacitor 204 may be adjusted in view of the capacitive properties of the conductive element 202.

In the FIG. 2 embodiment, when the current flows left to right along the conductive element 202, the magnetic field 112 oscillates around the conductive element 202 in a tangential manner such that the magnetic field 112 oscillates in and out of the two-dimensional plane (e.g., the surface of the page on which the conductive element 202 is drawn) that includes the conductive element 202.

As illustrated in FIG. 2, an inductor 212 may be disposed near the center of the conductive element 202. In this instance, the inductor 212 may be located near the antinode 124 of the magnetic field 112. In this way, the inductor 212 may be exposed to the maximum magnitude of the magnetic field 112 generated by the signal received from the RF power source 104. Accordingly, the current induced in the inductor 212 may be related to or in proportion to the magnitude of the magnetic field 112. The alternating direction of the magnetic field 112 may induce an alternating current in the inductor 212 that may be approximately 180 degrees out of phase in each direction. In this way, the current, or power generated by the current, may be split between a first output 214 and a second output 216. In the FIG. 2 embodiment, the current of both outputs 214, 216 may be applied to the same process chamber 106 or to separate antennas (not shown) within the process chamber 106. However, in another embodiment, the current transmitted from the RF power source 104 may be split between two process chambers (not shown).

For purposes of explanation, the coils of the inductor may be induced to flow current by the presence of a nearby magnetic field. The coils of the inductor may form a magnetic field intercept surface area that extends between the continuous portions of the wire that form the inductor. For example, in a loop inductor (not shown) that may be formed by a wire that forms a circular loop, the magnetic field intercept surface area may be formed within the plane of the interior portion of the circular loop. In this way, when a magnetic field is passes through magnetic field intercept surface area and is perpendicular to the magnetic field intercept surface area, the magnetic field may induce a relative maximum amount of current in the circular loop inductor. Similarly, another magnetic flux intercept surface area may be formed between the coil wire of the inductor 212. The magnetic field may be intercepted by magnetic field intercept surface area of the inductor 212 which may induce current flow through the inductor 212. In another embodiment, the magnetic flux intercept surface area may be similar to a Gaussian surface that may be used to determine the flux of a magnetic field. The boundaries of the Gaussian surface may be determined by the arrangement of the wire that may form the inductor. The wire arrangement may be, but is not limited to, a circular loop or a coil as shown in FIG. 2 (e.g., inductor 212).

Accordingly, in the FIG. 2 embodiment, the inductor 212 may also have a magnetic flux intercept surface area that may be positioned to be perpendicular to the magnetic field generated by the conductive element 202. In this embodiment, the inductor 212 may be placed substantially parallel to the conductive element 202, such that the magnetic flux intercept surface area may be substantially perpendicular to the magnetic field generated by the conductive element 202. However, the system 200 may still be operational when the magnetic flux intercept surface area of the inductor 212 is not substantially parallel to the magnetic field generated by the conductive element 202. The positioning of the magnetic flux intercept surface area in a substantially perpendicular manner merely increases the efficiency of inducing more current through the inductor 212. The perpendicular arrangement of magnetic field and the intercept surface area may not be required to operate the system 200 as described in this application.

In another embodiment, the conductive element 202 may be arranged in any geometric manner that may enable an alternating current flow generated from the RF power source 104. The geometric conductive element (not shown) may maintain an alternating magnetic field (not shown) that may include an antinode that designates the location of the maximum magnitude of the magnetic field. Accordingly, an inductor (not shown) may be placed near, adjacent to, or at the antinode. In another embodiment, the inductor may be disposed along a majority of the length of the conductive element. The conductive element may have an antinode location that may be based, at least in part, on the geometry of the conductive element. In this way, the inductor may disposed or arranged in a manner that uses or exploits the antinode to optimize the amount of current that can be induced within the inductor. For example, the conductive element may be arranged in coil-like (e.g., helical) geometry between the first capacitor 204 and the second capacitor 206. In this instance, the inductor (not shown) may also be arranged in a coil-like geometry to intersect or to be adjacent to the antinode of the coil-like conductive element. For example, the coil-like conductive element and inductor may include windings that are arranged in approximately an opposite manner. The windings for each component may have wave a like geometry and may be arranged in a way that the geometric waves of the components are out of phase with each other. In one specific embodiment, the geometric waves may appear to be approximately 180 degrees out of phase.

In other embodiments, the conductive element (e.g., 202) and the inductor are arranged, such that the inductor (e.g., 212) is parallel to the magnetic field of the conductive element. In this instance, the conductive element (not shown) may not be linear as shown in FIG. 2.

The power splitter 102 may also include impedance capacitor 218 that may be tuned to match the impedance of the RF power source 104 and the impedance of the process chamber 106 or any other output device that may be coupled to the power splitter 102. Impedance may be an indication of an amount of opposition a circuit has to alternating current. In addition to resistance, the impedance may also reflect the opposition caused by inductance or capacitance generated in an AC circuit. In the embodiment illustrated in FIG. 3, the impedance capacitor 218 may be coupled to electrical ground 210.

Figure 3:
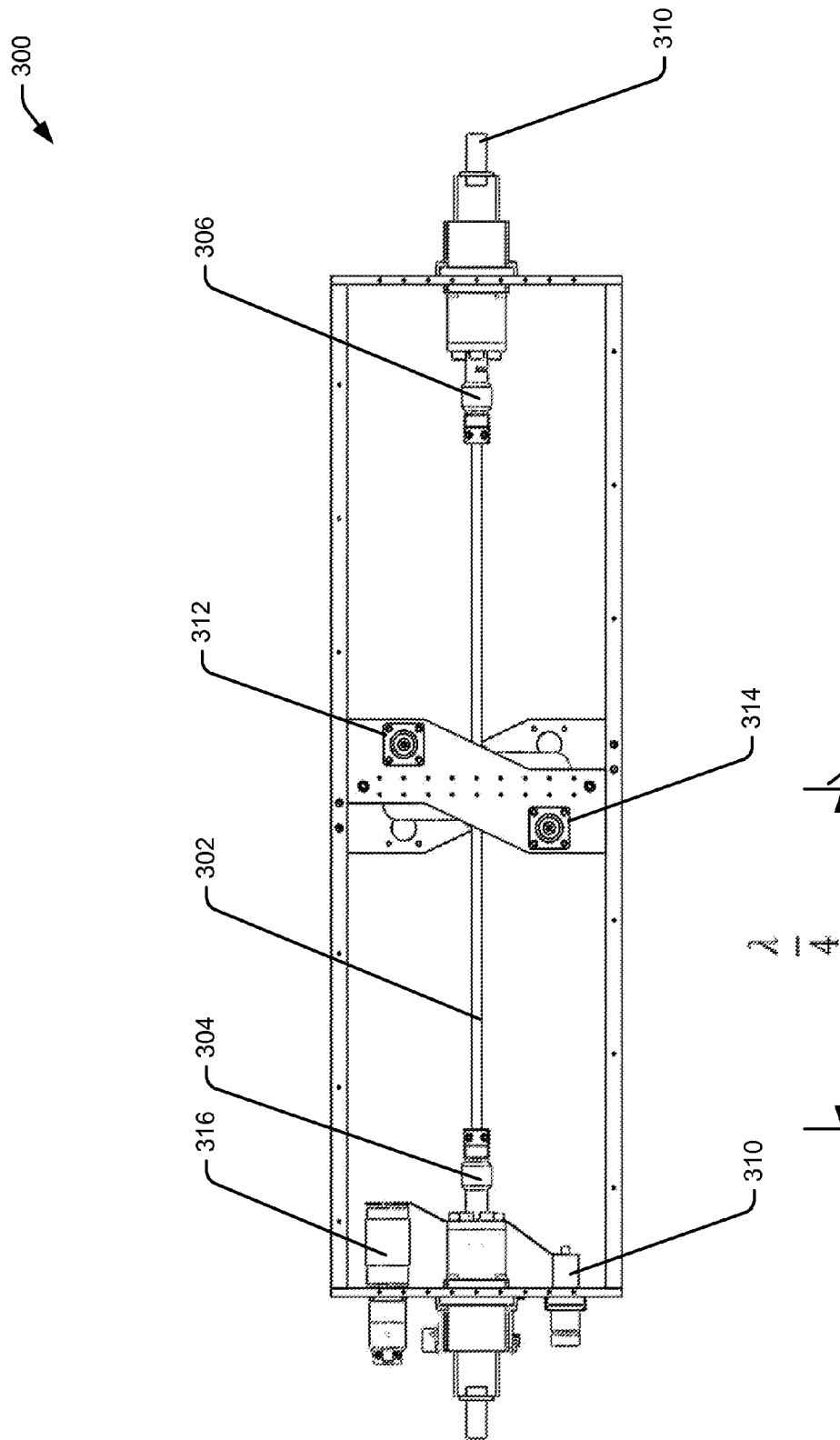
FIG. 3 illustrates a top view of one embodiment of the power splitter and impedance matcher as described in one or more embodiments of the disclosure.

FIG. 3 illustrates a top view of one embodiment of the power splitter 300 that may receive a current signal from the RF power source 104 and provide at least two current signals to one or more output devices (e.g., process chamber 106). The power splitter 300 may include similar elements as described above in the description of FIG. 2. For example, the elements may include a conductive rod 302 that may be disposed between a first capacitor 304 and a second capacitor 306. The two capacitors 304, 306 may be used to maintain a standing magnetic field (not shown) along the conductive rod 302. The magnetic field may include an antinode (not shown) that may be located approximately a ¼ wavelength of the signal provided by the RF power source 106. In this embodiment, the ¼ wavelength distance 308 may be approximately half the distance of the conductive rod 302 between the two capacitors 304, 306. The inductor (not shown in FIG. 3) may also be located near the center of the conductive rod 302 or located approximately equidistant between the first capacitor 304 and the second capacitor 306. The inductor may be disposed tangentially to the magnetic field emanating from the conductive rod 302. For example, a longitudinal axis of the inductor may be substantially parallel to a plane that may include the conductive rod 302.

In the FIG. 3 embodiment, the second capacitor 306 may also be coupled to electrical ground 310. The inductor may also be coupled to two outputs 312, 314 that each may provide a signal to at least two output devices, such as antennas, as described above in the description of FIG. 2.

Figure 4:
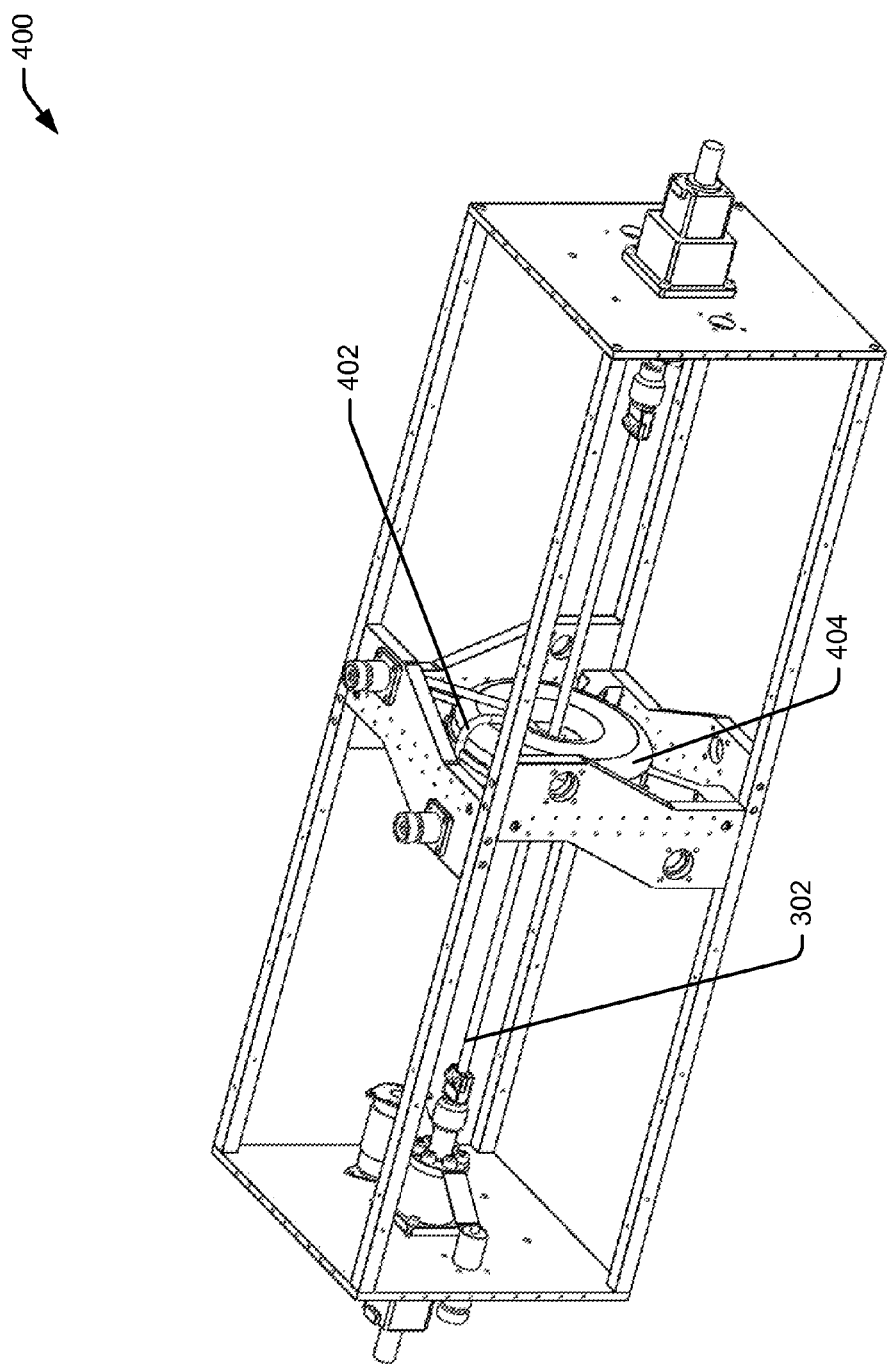
FIG. 4 illustrates a perspective view of one embodiment of the power splitter and impedance matcher as described in one or more embodiments of the disclosure.

FIG. 4 illustrates a perspective view 400 of one embodiment of the power splitter 300 that designates the location of the inductor 402 relative to the conductive rod 302. The perspective view 400 may be used to show the position of the inductor 402 that was not visible in the top view of power splitter 300 in FIG. 3. As noted above, the inductor 402 may be disposed in a substantially parallel manner to the conductive rod 302, such that the magnetic flux intercept surface area of the inductor (not shown) may be substantially perpendicular to the magnetic field generated by the conductive rod 302. In this specific embodiment, the inductor 402 may be wound around a supporting device 404 that enables the inductor to maintain a coil-like geometry. The supporting device 404 may be, but is not limited to, a toroidal shaped object that supports and/or maintains the shape of the inductor 402 wire.

As shown in FIG. 4, the supporting device 404 may also be aligned or substantially centered around the conductive rod 302. In this way, the inductor 402 may intercept the magnetic field (not shown) that is circling around the conductive rod 302. The magnetic field being generated based, at least in part, on the alternating current that may be flowing along the conductive rod 302.

Figure 5:
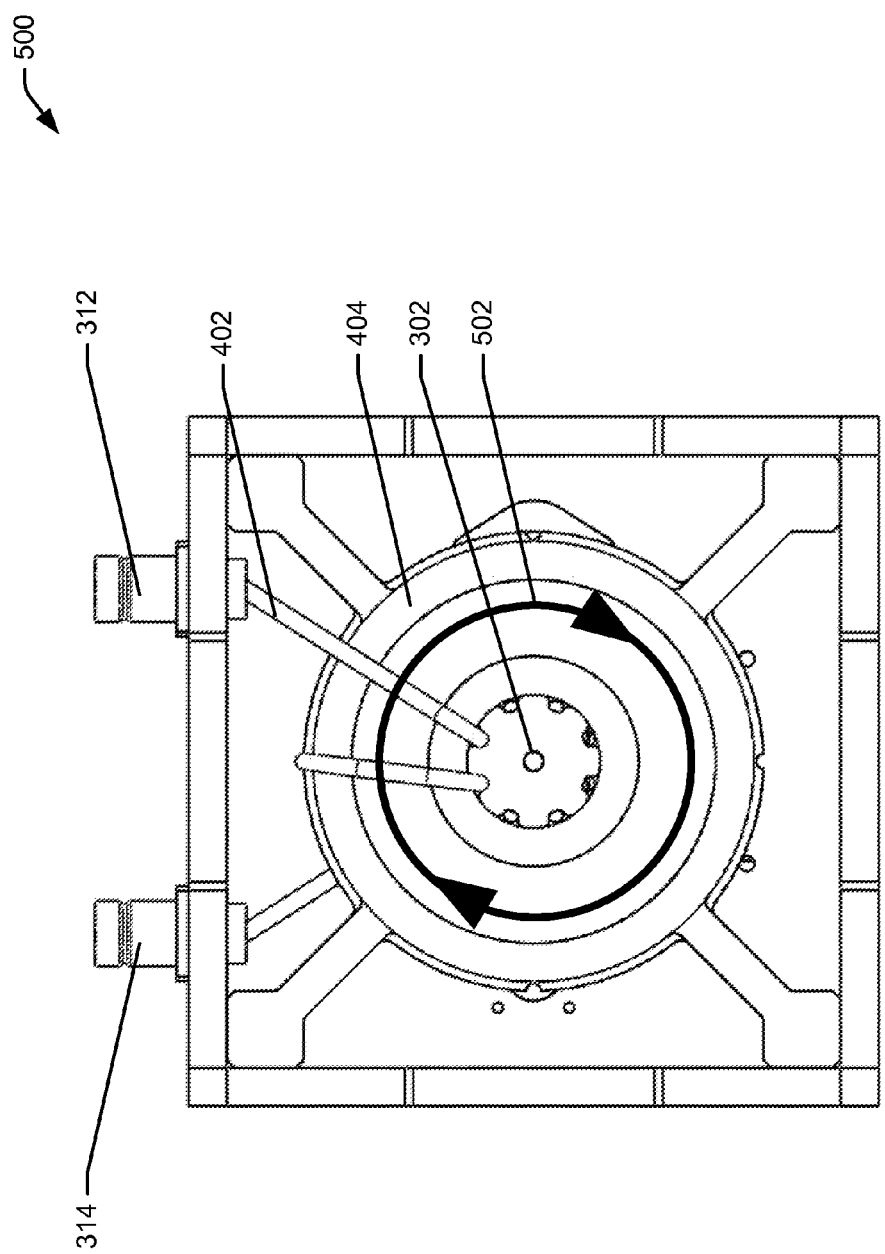
FIG. 5 illustrates a one embodiment of an inductor used in the power splitter and impedance matcher as described in one or more embodiments of the disclosure.

FIG. 5 illustrates a front view 400 of one embodiment of the inductor 402 and supporting device 404 used in the power splitter 300. As illustrated, the supporting device 404 may be centered on the conductive rod 302 and provide a conformal shape for the inductor 402 to use form windings. In one embodiment, the inductor may have two windings as illustrated in FIG. 5. However, the inductor 402 is not limited to two windings and may use any number of windings, as needed. The inductor 402 may intersect with a magnetic field that emanates from the conductive rod 302. The inductor 402 may include two or more windings and may not be limited to the number windings that are illustrated in FIG. 5.

In FIG. 5, the magnetic field may be represented by a single vector 502 that surrounds the conductive rod 302. The arrows of the vector indicating one direction of the magnetic field. However, the magnetic field may alternate in a direction that may be approximately 180 degrees from the illustrated direction. The magnetic field may be represented by several vectors, but a single vector is illustrated in FIG. 5 for the purposes explanation and not limitation.

Figure 6:
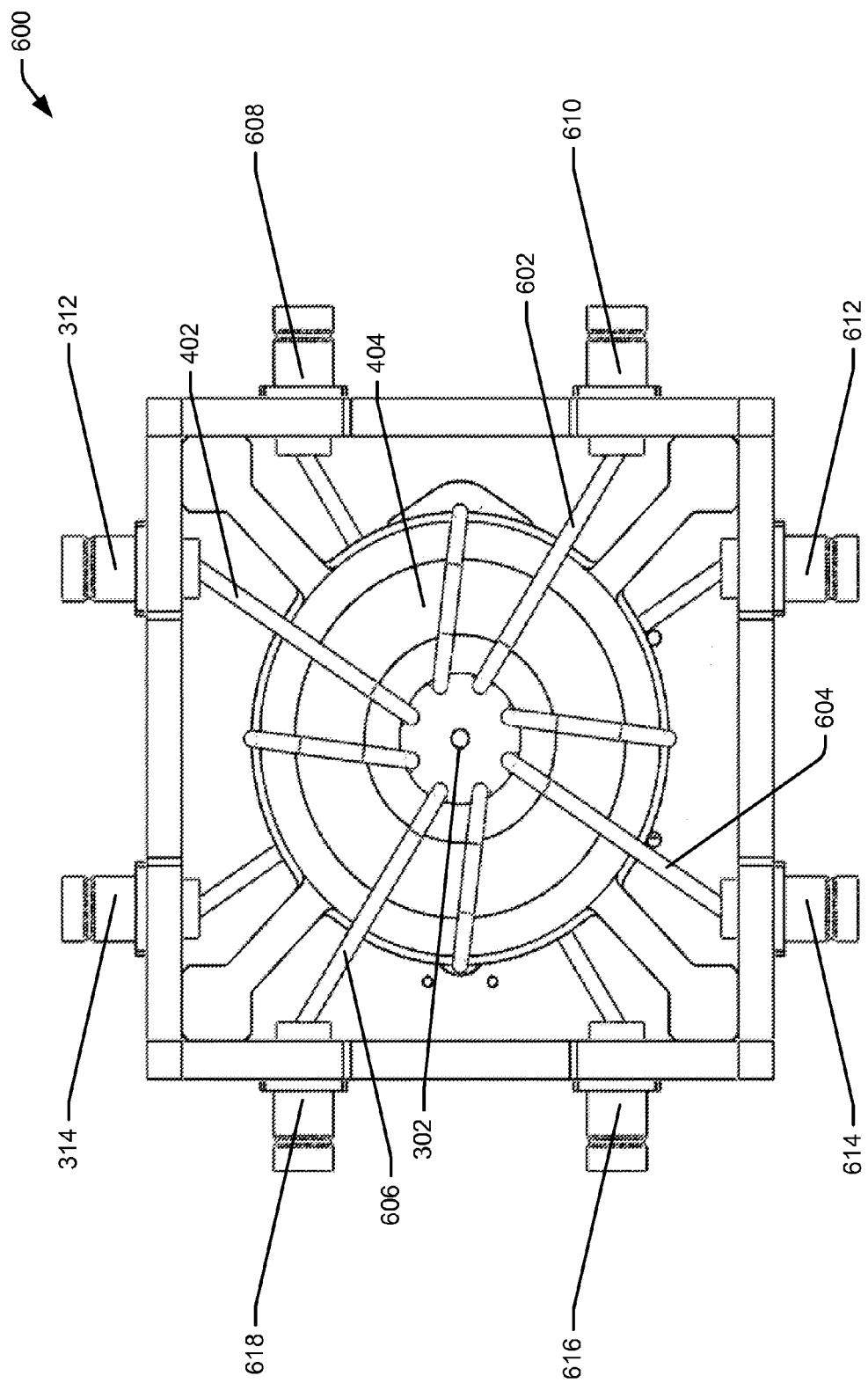
FIG. 6 illustrates embodiment of showing four of a plurality of inductors used in the power splitter and impedance matcher as described in one or more embodiments of the disclosure.

FIG. 6 illustrates a power splitter 600 that may include two or more inductors to split the current signal from RF power source 104 into two or more pairs of outputs. In this embodiment, the antinode of the magnetic field 112 extends around the conductive rod 302 at approximately a ¼ wavelength distance 308. For example, as shown in FIG. 5, the magnetic field vector 502 extends around the conductive rod 302. In this way, a plurality of inductors may be placed to intersect with or be influenced by the antinode magnetic field represented by the magnetic field vector 502.

In one embodiment, the powers splitter 600 may include, but is not limited to, four inductors 402, 602, 604, 606 may be placed near or adjacent to the antinode of the conductive rod 302. The inductors 402, 602, 604, 606 may be wound around a supporting device 404 to secure the inductors 402, 602, 604, 606 at the ¼ wavelength distance 308 or near the center of the conductive rod 302. The arrangement of the inductors 402, 602, 604, 606 may enable a current signal sent along the conductive rod 302 to be split eight ways. In that, each inductor (e.g., inductors 402, 602, 604, 606) may generate two current signals that may be out of phase with each other. For example, the first inductor 402 may generate a first current signal (not shown) that may be provided to first output 312 and a second current signal (not shown) that may be provided to a second output 314. As shown in FIG. 2, the first and second current signals may be provided to a process chamber 106.

The inductors 402, 602, 604, 606 may be coupled to their respective current connectors that may be coupled to one or more process chambers 106. For example, the second inductor 602 may be coupled to current connector 608 and current connector 610. The third inductor may be coupled to the current connector 612 and current connector 614. The fourth inductor 606 may be coupled to the current connector 616 and current connector 618.

In other embodiments, a plurality of inductors may be arranged within the magnetic field generated by the conductive rod 302. The inductors may be located at, near, or adjacent to the antinode of the conductive rod 302. However, the inductors are not required to be aligned with the antinode and may be within the range of any portion of the magnetic field. The number of inductors is not limited to four as shown in FIG. 6. The amount of inductors may be determined based, at least in part, on the current and/or frequency of the signal received from the RF power source 104.

Although only certain embodiments of this application have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A radio frequency (RF) power splitter, comprising:
a conductive element configured to transmit alternating current in a standing wave that comprises a low voltage point near a center portion of the conductive element, the conductive element being configured to generate a magnetic field that extends around an axis of the conductive element when the alternating current is received from a RF generator;
an inductor that is physically separate from the conductive element and adjacent to the low voltage point and is configured to receive the magnetic field that is generated by the conductive element, the inductor comprising:
a first end configured to transmit current based, at least in part, on the inductor receiving the magnetic field;
a second end configured to transmit current based, at least in part, on the inductor receiving the magnetic field, the current from the second end being out of phase from the current configured to be transmitted from the first end;
a first current output configured to be coupled to a first antenna within a plasma process chamber and to the first end of the inductor; and
a second current output configured to be coupled to a second antenna within the plasma process chamber and to the second end of the inductor.

2. The RF power splitter of claim 1, wherein the conductive element further comprises:
a first capacitor coupled at a first end of the conductive element, the first capacitor being in series with the conductive element;
a second capacitor coupled at a second end of the conductive element, the second capacitor being in series with the conductive element; and
a third capacitor at a first end of the conductive element, the third capacitor being in parallel with the conductive element.

3. The RF power splitter of claim 2, wherein the first and second capacitors are configured to control resonance of the standing wave and the third capacitor is configured to match an impedance of the RF power splitter and an impedance of the first and second antenna.

4. The RF power splitter of claim 1, wherein the current transmitted by the conductive element comprises a frequency between 40 MHz and 200 MHz.

5. The RF power splitter of claim 1, wherein the first, second, and third capacitor each comprise a capacitance between 10 pF and 50 pF.

6. The RF power splitter of claim 1, wherein the conductive element comprises a straight rod and the inductor comprise a pick-up coil inductor.

7. The RF power splitter of claim 1, wherein the conductive element comprises a helical coil and the inductor comprises a helical inductor.

8. The RF power splitter of claim 1, wherein the conductive element comprises a straight rod and the inductor comprises a straight rod inductor.

9. A radio frequency (RF) power splitter, comprising:
a conductive rod comprising:
a first end portion that is coupled to a first capacitor and configured to receive alternating current from a RF generator;
a second end portion that is coupled to a second capacitor, the first and second capacitor being configured to maintain a standing wave of the alternating current;
a third capacitor that is coupled in parallel with the conductive rod and that is configured to match an impedance of the RF power splitter with an impedance of at least one plasma chamber; and
a low voltage node within a center portion of the conductive rod, the low voltage node based, at least in part, on the standing wave;
an inductor that is offset from the low voltage node of the conductive rod and comprises an axis that is substantially perpendicular to the conductive rod, the inductor configured to provide a first current signal to a first end of the inductor that is out of phase with a second current signal that is provided to a second end of the inductor when the alternating current is applied to the conductive rod;
a first current output configured to be coupled to the at least one plasma chamber and the first end of the inductor; and
a second current output configured to be coupled to the at least one plasma chamber and the second end of the inductor.

10. The RF power splitter of claim 9, wherein the inductor comprises a first inductor, and further comprising:
a second inductor that is offset from the low voltage node and oriented in a substantially perpendicular manner to the conductive rod and oriented in a substantially perpendicular manner to the first inductor, the second inductor being configured to provide current to a first end of the second inductor that is out of phase with the current that is provided to a second end of the second inductor when the alternating current is applied to the conductive rod;
a third current output configured to be coupled to the at least one plasma chamber and to the first end of the second inductor; and
a fourth current output configured to be coupled to the at least one plasma chamber and to the second end of the second inductor.

11. The RF power splitter of claim 10, further comprising:
a third inductor that is offset from the low voltage node and oriented in a substantially perpendicular manner to the conductive rod and oriented in a substantially parallel manner to the first inductor, the third inductor being configured to provide current to a first end of the third inductor that is out of phase of current that is provided to a second end of the third inductor when the alternating current is applied to the conductive rod;
a fifth current output configured to be coupled to the at least one plasma chamber and to the first end of the third inductor; and
a sixth current output configured to be coupled to the at least one plasma chamber and to the second end of the third inductor.

12. The RF power splitter of claim 9, wherein the inductor comprises a first inductor and the at least one plasma chamber comprises a first plasma chamber, the RF power splitter further comprising:
a second inductor that is offset from the low voltage node and oriented in a substantially parallel manner to the conductive rod and oriented in a substantially perpendicular manner to the first inductor, the second inductor configured to provide current to a first end of the second inductor that is approximately 180 degrees of out phase of current that is provided to a second end of the second inductor when the frequency of current is applied to the conductive rod;

a third current output configured to be coupled to a second plasma chamber and to the first end of the second inductor; and a fourth current output configured to be coupled to the second plasma chamber and to the second end of the second inductor.

13. The RF power splitter of claim 9, wherein the conductive rod comprises a length that is based, at least in part, on a frequency of the alternating current that is generated by the RF generator.

14. The RF power splitter of claim 9, wherein the first capacitor and the second capacitor are coupled in series with each other and coupled in parallel to the third capacitor.

15. The RF power splitter of claim 9, wherein the alternating current comprises a frequency between 40 MHz and 200 MHz and the first and second capacitors comprise a capacitance between 10 pF and 50 pF.

16. The RF power splitter of claim 9, wherein the first current signal at the first end of the inductor is approximately 180 degrees out of phase of the second current signal at the second end of the inductor.

17. The RF power splitter of claim 9, wherein the inductor comprises a pick up coil inductor.

18. A radio frequency (RF) power splitter, comprising:
a conductive element configured to maintain a standing wave of an alternating magnetic field and to match an impedance of the RF power splitter to an impedance of a plasma process chamber;
an inductive element configured to generate a first alternating current signal and a second alternating current signal based, at least in part, on being exposed to the alternating magnetic field, the first alternating current signal being out of phase from the second alternating current signal;
a first output that is configured to provide the first alternating current signal to a first antenna in the plasma process chamber; and
a second output that is configured to provide the second alternating current signal to a second antenna in the plasma process chamber.

19. The RF power splitter of claim 18, wherein the conductive element comprises:

a conductive rod comprising a first end portion and a second end portion;
a first capacitor coupled in series with the first end portion of the conductive rod;
a second capacitor coupled in series with the second end portion of the conductive rod, the first capacitor and the second capacitor being configured to maintain the standing wave; and
a third capacitor that is coupled in parallel with the conductive rod and is configured to match the impedance of the RF power splitter to the plasma process chamber.

20. The RF power splitter of claim 18, wherein the standing wave comprises a low voltage node on a center portion of the conductive element and the inductive element is adjacent to and physically separated from the low voltage node.

21. The RF power splitter of claim 18, wherein the inductive element comprises a first inductive element, the RF power splitter further comprising a plurality of inductive elements that are adjacent to the low voltage node and physically separated from the low voltage node, the first inductive element, and each other.

22. The RF power splitter of claim 21, wherein the plurality of inductive elements are each configured to generate two alternating current signals that are out of phase with each other.

23. The RF power splitter of claim 21, further comprising a second inductive element configured to generate a third alternating current signal and a fourth alternating current signal based, at least in part, on being exposed to the alternating magnetic field, the third alternating current signal being out of phase from the fourth alternating current signal, the second inductive element being adjacent to the low voltage node and physically separated from the low voltage node, the first inductive element, and the plurality of inductive elements.

24. The RF power splitter of claim 18, wherein the first alternating current signal and the second alternating current signal are approximately 180 degrees of phase.

* * * * *